(12) United States Patent
Johnson et al.

(10) Patent No.: US 6,304,491 B2
(45) Date of Patent: Oct. 16, 2001

(54) INTEGRATED SEMICONDUCTOR MEMORY

(75) Inventors: Bret Johnson, München; Robert Kaiser, Kaufering, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/776,950

(22) Filed: Feb. 5, 2001

(30) Foreign Application Priority Data

Feb. 3, 2000 (DE) .............................................. 100 04 648

(51) Int. Cl.$^7$ ....................................................... G11C 7/00
(52) U.S. Cl. ................ 365/189.05; 365/203; 365/189.01
(58) Field of Search ............................. 365/189.05, 190, 365/205, 203, 207, 208, 233

(56) References Cited

U.S. PATENT DOCUMENTS

| 5,015,891 | * | 5/1991 | Choi | 327/53 |
| 5,526,314 | * | 6/1996 | Kumar | 365/207 |
| 5,703,830 | | 12/1997 | Yasuhiro | 365/233 |
| 6,130,848 | * | 10/2000 | Hsu et al. | 365/207 |
| 6,198,682 | * | 3/2001 | Proebsting | 365/207 |

* cited by examiner

*Primary Examiner*—Son Mai
(74) *Attorney, Agent, or Firm*—Herbert L. Lerner; Laurence A. Greenberg; Werner H. Stemer (57) ABSTRACT

An integrated semiconductor memory having memory cells (MC) for storing data signals (DQ), has a memory sense amplifier (2) with an input (21) for a data signal (DQ) of one of the memory cells (MC), and an output (23) for at least one output signal (RD0). A driver circuit (3) is connected to the output (23) of the memory sense amplifier (2). The driver circuit (3) can be activated or deactivated only by the output signal (RD0) of the memory sense amplifier (2). A signal line (4) is connected to the driver circuit (3), a precharging circuit (5) and to a memory circuit (6). A terminal (7) for a control signal (C) is connected to the memory sense amplifier (2), the precharging circuit (5) and the memory circuit (6). As result of a driver circuit (3) which has a relatively low level of circuit complexity, the space requirements are kept relatively small. In addition, high switching speeds are made possible during the reading operation.

11 Claims, 5 Drawing Sheets

FIG 2

INTEGRATED SEMICONDUCTOR MEMORY

BACKGROUND OF THE INVENTION

Field of the Invention

The present invention relates to an integrated semiconductor memory having memory cells for storing data signals, having a sense amplifier, a signal line and a memory circuit.

More recent generations of integrated semiconductor memories have an increasing integration density and an increasing number of integrated functions. A semiconductor memory is usually connected to further components which together form a computer system, for example. For semiconductor memories which have relatively large dimensions and relatively long conductor tracks it is becoming more and more difficult to achieve the data access times which are required by components which switch at high speed, for example the computer system.

A data access can usually be divided into a plurality of function blocks. In a first function block, access commands are decoded and the respective memory cell address generated. In a semiconductor memory which has, for example, a memory cell field in the form of a matrix, the column addresses are decoded in a second function block, a respective column line is selected by means of a column selection signal, and the data to be read out are amplified in a memory sense amplifier and transmitted outside of the memory cell field. There, they are usually fed to a further memory sense amplifier. In a third function block, a data signal which is to be read out is transmitted by this memory sense amplifier to an internal memory circuit or to an output buffer of the integrated memory, for example.

To enable a data signal which is to be read out to be transmitted to an internal memory circuit or an output buffer it is possible, for example, to use a data line pair with states which are differential with respect to one another. Here, one of the two lines has a signal crossover in each read cycle. As soon as the crossover is saved in a memory circuit, appropriate charging of the respective other line takes place in a known manner. This configuration requires a comparatively large amount of space on the semiconductor memory.

The data signal which is to be read out can alternatively be transmitted on a single static data line. This signal line, which connects the memory sense amplifier and either the internal memory circuit or the output buffer, has at most one signal crossover for each read cycle. In order to obtain the shortest possible access times, it is necessary to optimize both types of signal crossovers (for example "log. 0"=L to "log. 1"=H, "log. 1"=H to "log. 0"=L) in terms of their switching times. The minimum access time is limited here to the slower signal crossover of the two signal crossovers.

SUMMARY OF THE INVENTION

It is accordingly an object of the invention to provide an integrated semiconductor memory which overcomes the above-mentioned disadvantageous of the prior art memories of this general type. The integrated semiconductor memory has a circuit configuration for reading out data signals that requires as little space as possible and that has comparatively high switching speeds for signal crossovers of the data signals to be read out.

With the foregoing and other objects in view there is provided, in accordance with the invention an integrated semiconductor memory that includes a plurality of memory cells. Each one of the memory cells is for storing a data signal. A memory sense amplifier is provided which has an input for receiving the data signal from one of the plurality of memory cells and has at least one output for providing an output signal. A driver circuit is provided which has an output and which has an input connected to the output of the memory sense amplifier. The driver circuit is capable of being activated or deactivated only by the output signal of the memory sense amplifier. A signal line is connected to the output of the driver circuit. A precharging circuit is connected to the signal line. A memory circuit is provided which has an input connected to the signal line and has an output. A terminal is provided for receiving a control signal. The terminal is connected to the memory sense amplifier, the precharging circuit and the memory circuit.

In accordance with an added feature of the invention, there is provided a terminal for receiving a first supply potential, and the driver circuit includes a transistor having a control path connected between the signal line and the terminal for receiving the first supply potential. The transistor of the driver circuit has a control terminal connected to the input of the driver circuit.

In accordance with an additional feature of the invention, there is provided a terminal for receiving a second supply potential, and the precharging circuit includes a transistor having a control path connected between the signal line and the terminal for receiving the second supply potential. The transistor of the precharging circuit has a control terminal connected to the terminal for receiving the control signal.

In accordance with another feature of the invention, the memory sense amplifier includes a further output for providing an output signal, and the integrated semiconductor memory further includes a logic processing unit having an output connected to the control terminal of the transistor of the precharging unit. The logic processing unit has an input connected to the terminal for receiving the control signal and has another input connected to the further output of the memory sense amplifier.

In accordance with a further feature of the invention, the memory sense amplifier includes a further output for providing an output signal, and the integrated semiconductor memory further includes a holding circuit that includes a transistor having a control path connected between the signal line and the terminal for receiving the second supply potential. The transistor of the holding circuit has a control terminal connected to the further output of the memory sense amplifier.

In accordance with another added feature of the invention, the data signal from the one of the plurality of the memory cells is formed from data selected from the group consisting of a data item having a first logic state and a data item having a second logic state, and the output signal from the at least one output of the memory sense amplifier defines a first output signal having a first state and a second state. The first state indicates that the data item having the first logic state is being read out by the memory sense amplifier. The second state indicates that the data item having the first logic state is not being read out by the memory sense amplifier. The memory sense amplifier includes an additional output providing an output signal defining a second output signal having a first state and a second state. The first state indicates that the data item having the second logic state is being read out by the memory sense amplifier. The second state indicates that the data item having the second logic state is not being read out by the memory sense amplifier.

In accordance with another additional feature of the invention, there is provided, a plurality of identical memory sense amplifiers, only one of the plurality of the memory sense amplifiers being activated at a time; and a plurality of driver circuits, each one of the plurality of the driver circuits connected to the signal line and assigned to a respective one of the plurality of the memory sense amplifiers.

In accordance with yet an added feature of the invention, there is provided, a decoder that is connected to the plurality of the memory sense amplifiers. The plurality of the memory cells are combined to form units of column lines and row lines. The decoder is for selecting one of the column lines.

In accordance with yet an additional feature of the invention, the control signal is a regular clock signal.

In accordance with yet a further feature of the invention, the integrated semiconductor memory is embodied as a dynamic semiconductor memory.

In accordance with a concomitant feature of the invention, the integrated semiconductor memory is embodied as a synchronous dynamic semiconductor memory.

To read out a data signal of one of the memory cells, an appropriate control signal, for example, is applied. The precharging circuit is deactivated after a signal crossover of the control signal. The memory sense amplifier then reads in, at the input, a data signal of a memory cell which is to be read out. An appropriate output signal is generated at the output of the memory sense amplifier. This output signal is used as an input signal of a driver circuit which is activated, for example, by the output signal of the memory sense amplifier. A signal crossover is correspondingly generated on the connected signal line at the output of the driver circuit. As a consequence, the state of the signal line changes to a state which is complementary to the precharging signal. The signal line is discharged, for example. The memory circuit which is likewise connected to the signal line stores this change of state, which can be obtained at the output of the memory circuit. The memory circuit is also controlled here by the control signal and is appropriately enabled for the reading out of the data signal.

After the read access is terminated, the input of the memory circuit is disabled for further operations. The data signal which has been previously read out from the memory cell field can be read out at the output of the memory circuit. The memory sense amplifier is deactivated, as result of which the output signal of the memory sense amplifier is correspondingly reset. Finally, the precharging circuit is correspondingly activated, as result of which the signal line is charged again to the original state.

In order to read out, for example, a data signal which has a state which is complementary to the state of the previously read-out data signal, a new read cycle is initiated. The input of the memory circuit is, in turn, enabled by means of an appropriate control signal. The memory circuit stores the state of the signal line at the time at which the input of the memory circuit is enabled. Because the data signal which is to be read out is complementary to the previously read-out data signal, the previously activated output signal of the memory sense amplifier is not activated in this read cycle. As a result, the driver circuit is not activated either. The signal line which is charged by the precharging circuit is consequently not discharged by the driver circuit. The memory circuit thus stores the state of the signal line after the precharging by the precharging circuit. In order to terminate the read cycle, the memory circuit is in turn disabled, and the memory sense amplifier deactivated.

Since the precharging potential of the signal line is stored in the memory unit in the second read operation described, a high switching speed is achieved at the output of the memory circuit. The driver circuit is activated or deactivated only by the output signal of the memory sense amplifier. The output signal of the memory sense amplifier indicates here the reading out of a data item with a specific logic state or the non-reading out of a data item with the specific logic state by means of the memory sense amplifier. Because only this output signal of the memory sense amplifier is present at the input of the driver circuit, the driver circuit can be implemented at comparatively low cost.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE INVENTION

DESCRIPTION OF THE PREFERRED EMBODIMENTS

Figure 1:
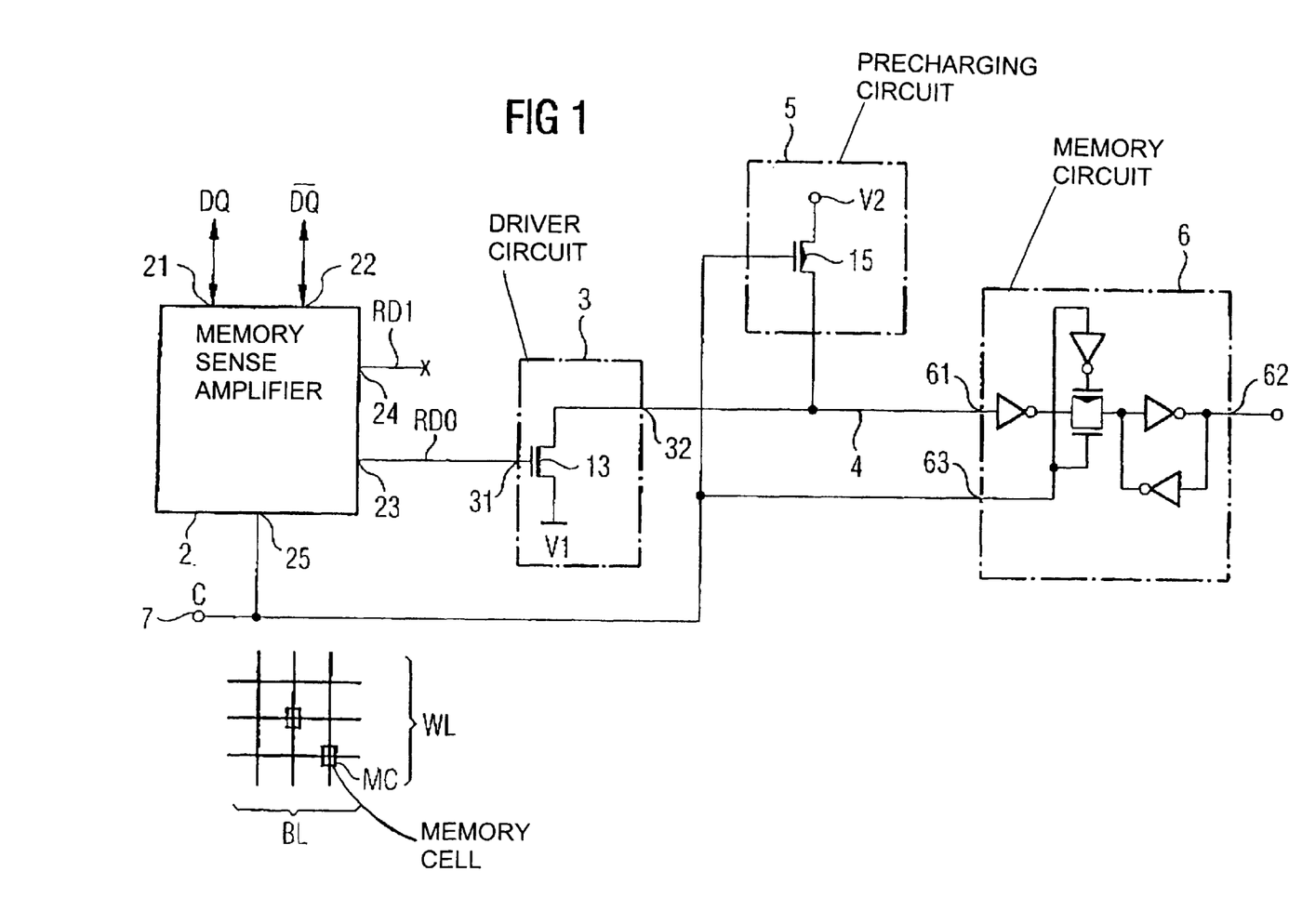
FIG. 1 shows an embodiment of an inventive semiconductor memory.

Referring now to the figures of the drawing in detail and first, particularly, to FIG. 1 thereof, there is shown a simple embodiment of a semiconductor memory having memory cells MC, which are combined, for example, to form units of row lines WL and column lines BL. The memory cells MC are used to store a data signal DQ or $\overline{DQ}$ which respectively has a first logic state L or a second logic state H.

A first output signal RD0 of the memory sense amplifier 2 indicates the reading out of a data item with the first logic state L by the memory sense amplifier 2 by means of a first state H. The first output signal RD0 indicates the non-reading out of a data item with the first logic state L by the memory sense amplifier 2 by means of a second state L. A second output signal RD1 of the memory sense amplifier 2 indicates the reading out of a data item with the second logic state H by the memory sense amplifier 2 by means of a first state H. The second output signal RD1 indicates the non-reading out of a data item with the second logic state H by the memory sense amplifier 2 by means of a second state L. The states of the first output signal RD0 and of the second output signal RD1 signify here, for example, the following: RD0=RD1=L indicates that no data signal DQ is read out. RD0=H indicates, for example, that a data signal DQ=L is read out by the memory sense amplifier. RD1=H indicates, for example, that a data signal DQ=H is read out of the memory cell field. The intention here has been to ensure that RD0=RD1=H cannot occur.

The memory sense amplifier 2 is provided with an input 21 for receiving the data signal DQ and with an input 22 for receiving the data signal $\overline{DQ}$ of one of the memory cells MC. The memory sense amplifier 2 is also provided with an output 23 for providing the output signal RD0 and with an output 24 for providing the output signal RD1. The memory sense amplifier 2 is connected to a terminal 7 for a control signal C via the further terminal 25. A driver circuit 3 has an output 32 and an input 31 which is connected to the output 23 of the memory sense amplifier 2. The driver circuit 3 can be activated or deactivated only by the output signal RD0 of the memory sense amplifier 2. A signal line 4 for transmitting a logic signal is connected to the output 32 of the driver circuit 3. A precharging circuit 5 is connected to the signal line 4. A memory circuit 6, having an input 61 and an output 62, is also connected to the signal line 4. The precharging circuit 5 and the memory circuit 6 are, like the memory sense amplifier 2, connected to the terminal 7 for the control signal C. The memory circuit 6 is embodied, for example, as a so-called latch circuit.

The driver circuit 3 includes, for example, a transistor 13 whose control path is connected between the signal line 4 and a terminal for a first supply potential V1. The control terminal of the transistor 13 is connected to the input 31 of the driver circuit 3, and thus to the output 23 of the memory sense amplifier 2.

The precharging circuit 5 includes a transistor 15 whose control path is connected between the signal line 4 and a terminal for a second supply potential V2. The control terminal of the transistor 15 is connected to the terminal 7 for the control signal C. The first supply potential V1 represents the first logic state L of a data signal of a memory cell. The second supply potential V2 represents the second logic state H which is complementary thereto.

The method of operation of the circuit configuration illustrated in FIG. 1 is explained in more detail below with reference to the flowchart from FIG. 4.

In an initial state, the signal line 4 is precharged to the state H by the precharging circuit 5. This is achieved by means of the conductive transistor 15 at whose control input the control signal C=L is present.

A read cycle is initiated by means of a rising edge of the control signal C. Subsequently, a memory access is carried out, as result of which the data signals DQ or $\overline{DQ}$ are present at the inputs 21 and 22 of the memory sense amplifier 2. The control signal C also acts as an activation signal for the memory sense amplifier 2 which reads in the data signals DQ and $\overline{DQ}$ and amplifies them. The signals RD1 and RD0 are correspondingly applied to the outputs 23 and 24 of the memory sense amplifier 2. Furthermore, the precharging circuit 5 is deactivated by the control signal C.

Figure 4:
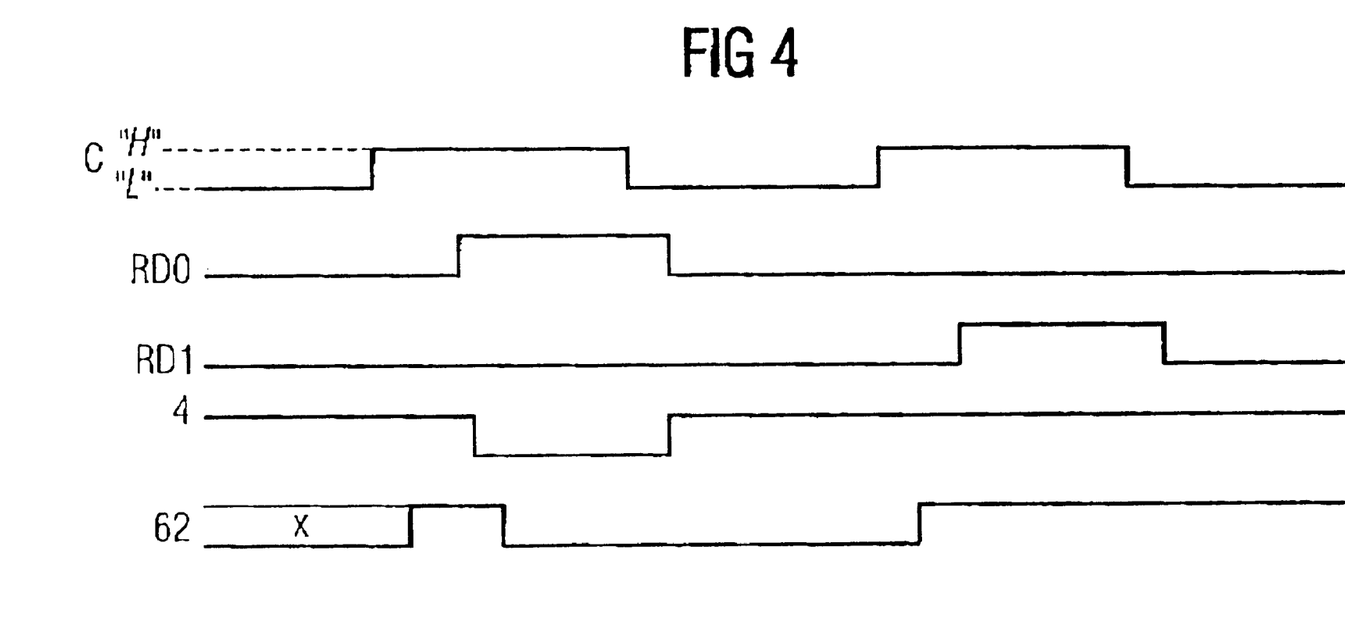
FIG. 4 shows a flowchart relating to the circuit shown in FIG. 1.

According to the flowchart in FIG. 4, the first rising edge of the control signal C indicates the reading of a data signal DQ=L. After the memory sense amplifier 2 has read in the data signal DQ or $\overline{DQ}$, the signal RD0=H is present at the output 23. This output signal RD0 of the memory sense amplifier 2 activates the transistor 13 of the driver circuit 3. As a result, the signal line 4 is discharged from the state H to the state L. The input 61 of the memory circuit 6 is enabled by an appropriate signal at the control input 63. The input 61 of the memory circuit 6 is enabled here if the control signal C assumes the state H. If the control signal C assumes the state L, the input 61 is deactivated. The signal line 4, which is discharged to the state L, indicates the state of the data signal DQ=L. This data signal appears at the output 62 of the memory circuit 6 after an internal delay time of the memory circuit 6.

At the next falling edge of the control signal C, the input of the memory circuit 6 is deactivated, but the output signal is maintained at the output 62 of the memory circuit 6. The read access is thus terminated, the memory sense amplifier 2 is deactivated, and the output signal RD0 is thus reset to the state L. The precharging circuit 5 is activated again, as a result of which the signal line 4 assumes the state H.

According to the flowchart in FIG. 4, the control signal C is a regular clock signal of, for example, a synchronous dynamic semiconductor memory. However, in principle it is also possible to respectively bring about the activation or deactivation of the described circuit components by a rising edge of the control signal C. The control signal C is in this case, for example, a control signal, generated for this purpose, of a control circuit which is provided for this purpose.

In a further read cycle, for example a data signal DQ=H is read out at the rising edge of the control signal C. The precharging circuit 5 is in turn deactivated. At the rising control signal C, the input 61 of the memory circuit 6 is enabled, as a result of which the output signal at the output 62 of the memory circuit 6 assumes the state H. In addition, the output signal RD1 of the memory sense amplifier 2 assumes the state H. However, this information is not necessary for the reading out on the signal line 4 because the signal line 4 and the output 62 of the memory circuit 6 already assume the state H as result of the precharging by the precharging circuit 5. For this reason, the output signal RD1 of the memory sense amplifier 2 is not connected to the driver circuit 3.

Because the driver circuit 3 can, as described above, be activated or deactivated only by the output signal RD0, its circuit complexity is advantageously reduced. As in the previous read operation, the second read operation is terminated by the following falling edge of the control signal C. The output signal RD1 assumes the state L again here.

Because the crossover from the state L to the state H takes place at the output 62 of the memory circuit 6 directly after the rising signal edge of the control signal C, this signal crossover takes place at an earlier time relative to the signal crossover during the previous read cycle. For this reason, the maximum time delay during the reading operation is determined only by the signal crossover on the signal line 4 from the state H to the state L. This has the advantage that the transistors of the memory circuit 6 can be optimized, especially with respect to this signal crossover. The signal crossover at the output 62 of the memory circuit 6 from the state L to the state H is, as described, uncritical in terms of timing and therefore has no influence on the described optimization process.

The fact that the driver circuit 3 shown in FIG. 1 requires, as described, relatively little expenditure in terms of circuitry provides further advantages. Only one PMOS transistor has to be provided between the terminal for the supply potential V2 and the signal line 4, and the location of the PMOS transistor in the integrated circuit can be independent from the location of the memory sense amplifier 2. As result of the reduced expenditure on circuitry for the driver circuit 3, the space required in the vicinity of the memory sense amplifier 2 is kept low. The fact that a minimum number of PMOS transistors is connected to the signal line 4 has a positive influence on the capacitive behavior of the signal line 4. The capacitive charging of the signal line 4 can be kept low.

Figure 2:
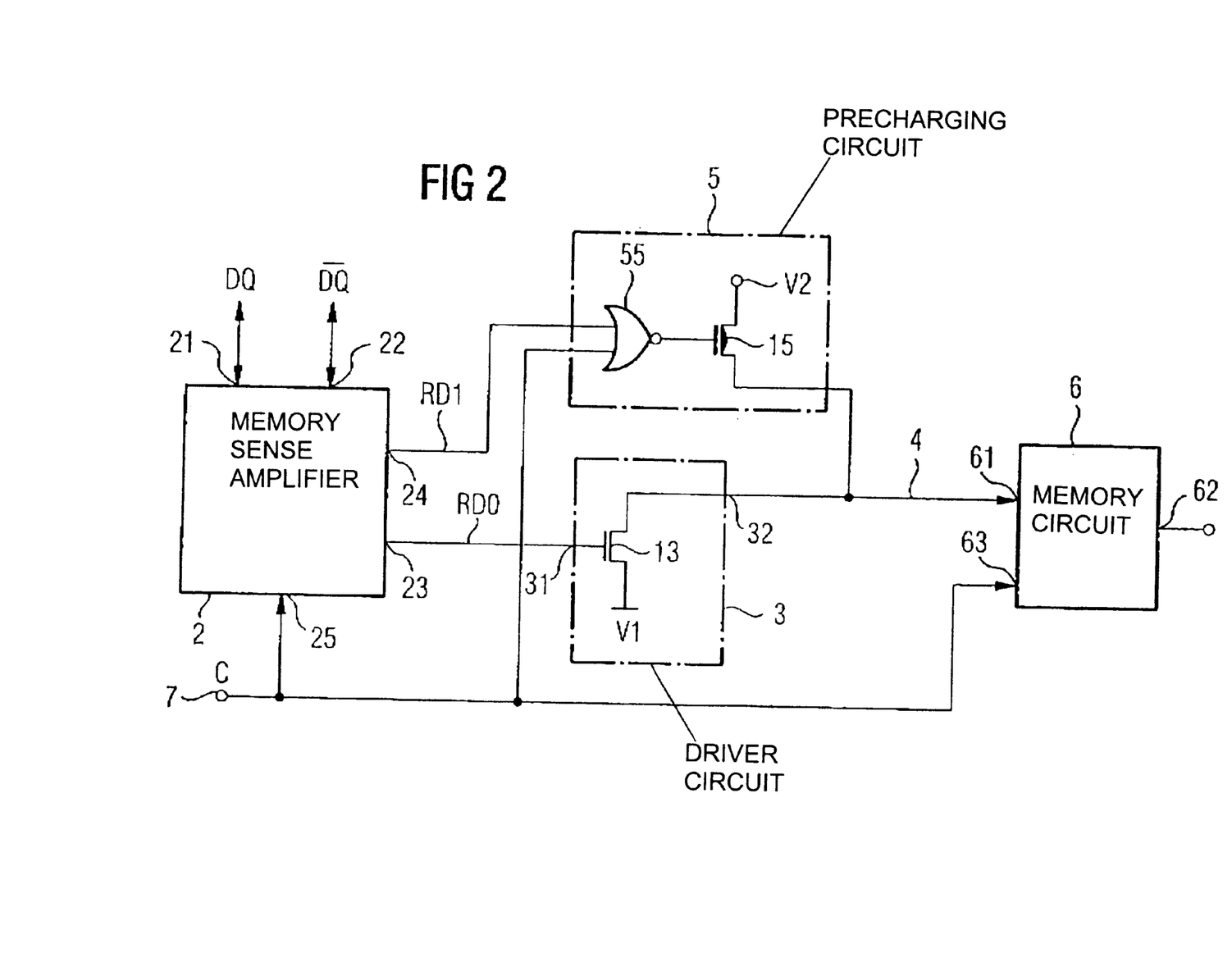
FIG. 2 shows an embodiment of the semiconductor memory with a modified precharging circuit.

FIG. 2 shows a development of the embodiment of the semiconductor memory according to FIG. 1. According to the development, the control terminal of the transistor 15 of the precharging circuit 5 is connected to a logic processing unit 55. The logic processing unit 55 is itself connected to the terminal 7 for the control signal C and to the terminal 24 for the output signal RD1 of the memory sense amplifier 2. This circuit has the advantage that the signal line 4 does not have any floating state during the read operation of a data signal DQ=H. The signal line 4 is kept at the state H by the output signal RD1=H. The precharging circuit 5 thus performs not only the precharging function but also a holding function for holding the state of the signal line 4. The transistor 15 of the precharging circuit 5 can have relatively small dimensions because of this function. In contrast, switching transistors, for example, of a driver circuit are given relatively large dimensions in order to be able to switch signal crossovers as quickly as possible.

Figure 3:
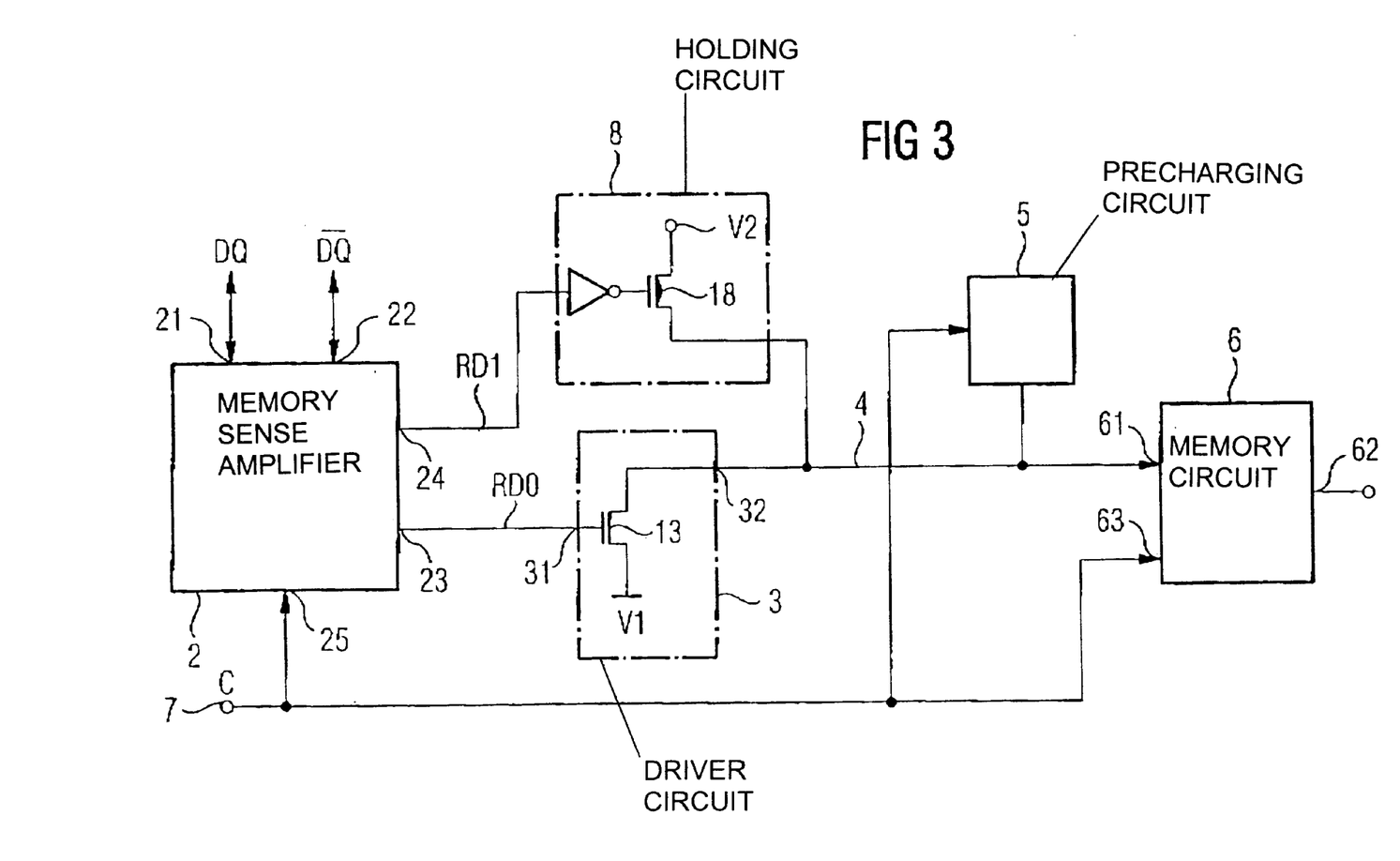
FIG. 3 shows an embodiment of the semiconductor memory with a holding circuit.

FIG. 3 illustrates a further embodiment of the semiconductor memory. The latter has a holding circuit 8 which includes a transistor 18 whose control path is connected between the signal line 4 and a terminal for the second supply potential V2. The control terminal of the transistor 18 is connected to the output 24 for the output signal RD1 of the memory sense amplifier 2. The function of the holding circuit will be explained in more detail below.

Because of the fine structures of an integrated semiconductor memory, the circuit configurations and conductor tracks which are provided on it are operated in an environment which has relatively intensive electrical noise. This noise is often caused on the respective conductor by capacitive coupling to the substrate or to other conductor tracks. In integrated semiconductor memories, a plurality of bit lines are typically read out in parallel in one read cycle so that a plurality of signal lines 4 configured one next to the other are simultaneously in an active state. During a read operation in which a data signal DQ=H is read, the signal line 4 is inactive for a brief time, being supplied with a fixed supply potential by the driver circuit 3 or the precharging circuit 5, for example. The signal line 4 is sensitive to capacitive coupling phenomena during this time.

The holding circuit 8, which is activated by the signal RD1 for the relevant time period, is provided in order to make the signal line 4 insensitive to these coupling phenomena. For the same reasons as described in the previous exemplary embodiment, the transistor 18 can be given relatively small dimensions in comparison to a switching transistor of a driver circuit. For this reason, in addition to the precharging circuit 5, relatively little space is required for the holding circuit 8.

Figure 5:
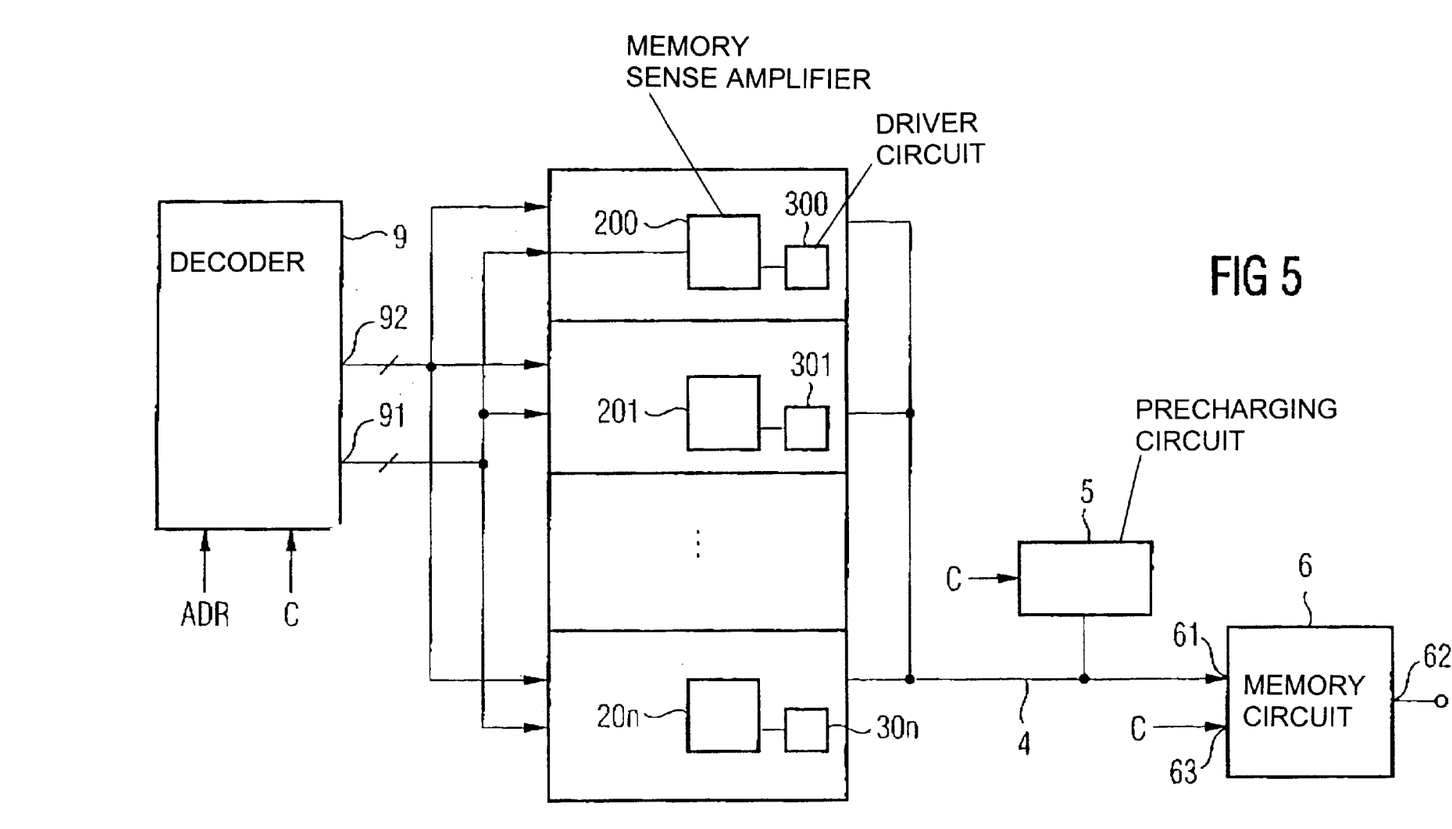
FIG. 5 shows an embodiment of the semiconductor memory with a plurality of memory sense amplifiers.

FIG. 5 shows an embodiment of the semiconductor memory that has a plurality of identical memory sense amplifiers 200 to 20n which are connected in parallel to the signal line 4. In this case, the control signal C must be combined with a column address decoding means in order to ensure that only one of the memory sense amplifiers 200 to 20n is activated. For this purpose, the semiconductor memory has a decoder 9 for selecting one of the column lines BL. An address ADR and the control signal C are fed to the decoder 9. One of the memory sense amplifiers 200 to 20n is selected via the output 91 of the decoder 9 and this is coordinated with the signal at the output 92 of the decoder 9 for selecting one of the column lines BL.

Respective driver circuits 300 to 30n are assigned to the respective memory sense amplifiers 200 to 20n in accordance with their number. By driving the memory sense amplifiers 200 to 20n using the signals at the outputs 91 and 92 of the decoder 9 it is ensured that just one data bit is output onto the signal line 4.

We claim:

1. An integrated semiconductor memory comprising:
    a plurality of memory cells, each one of said memory cells for storing a data signal;
    a memory sense amplifier having an input for receiving the data signal from one of said plurality of memory cells and having at least one output for providing an output signal;
    a driver circuit having an output and having an input connected to said output of said memory sense amplifier, said driver circuit capable of being activated or deactivated only by said output signal of said memory sense amplifier;
    a signal line connected to said output of said driver circuit;
    a precharging circuit connected to said signal line;
    a memory circuit having an input connected to said signal line and having an output; and
    a terminal for receiving a control signal, said terminal connected to said memory sense amplifier, said precharging circuit and said memory circuit.

2. The integrated semiconductor memory according to claim 1, comprising a terminal for receiving a first supply potential, said driver circuit including a transistor having a control path connected between said signal line and said terminal for receiving the first supply potential, said transistor of said driver circuit having a control terminal connected to said input of said driver circuit.

3. The integrated semiconductor memory according to claim 1, comprising a terminal for receiving a second supply potential, said precharging circuit including a transistor having a control path connected between said signal line and said terminal for receiving the second supply potential, said transistor of said precharging circuit having a control terminal connected to said terminal for receiving the control signal.

4. The integrated semiconductor memory according to claim 3, wherein said memory sense amplifier includes a further output for providing an output signal, and wherein the integrated semiconductor memory further comprises a logic processing unit having an output connected to said control terminal of said transistor of said precharging unit, said logic processing unit having an input connected to said terminal for receiving the control signal and having another input connected to said further output of said memory sense amplifier.

5. The integrated semiconductor memory according to claim 3, wherein said memory sense amplifier includes a further output for providing an output signal, and wherein the integrated semiconductor memory further comprises a holding circuit that includes a transistor having a control path connected between said signal line and said terminal for receiving the second supply potential, said transistor of said holding circuit having a control terminal connected to said further output of said memory sense amplifier.

6. The integrated semiconductor memory according to claim 1, wherein:
    the data signal from said one of said plurality of said memory cells is formed from data selected from the group consisting of a data item having a first logic state and a data item having a second logic state;
    said output signal from said at least one output of said memory sense amplifier defines a first output signal having a first state and a second state, the first state indicating that the data item having the first logic state is being read out by said memory sense amplifier, the second state indicating that the data item having the first logic state is not being read out by said memory sense amplifier; and said memory sense amplifier including an additional output providing an output signal defining a second output signal having a first state and a second state, the first state indicating that the data item having the second logic state is being read out by said memory sense amplifier, the second state indicating that the data item having the second logic state is not being read out by said memory sense amplifier.

7. The integrated semiconductor memory according to claim 1, comprising:

a plurality of identical memory sense amplifiers, only one of said plurality of said memory sense amplifiers being activated at a time; and a plurality of driver circuits, each one of said plurality of said driver circuits connected to said signal line and assigned to a respective one of said plurality of said memory sense amplifiers.

8. The integrated semiconductor memory according to claim 7, comprising:

a decoder connected to said plurality of said memory sense amplifiers; said plurality of said memory cells combined to form units of column lines and row lines, said decoder for selecting one of said column lines.

9. The integrated semiconductor memory according to claim 1, wherein the control signal is a regular clock signal.

10. The integrated semiconductor memory according to claim 1, wherein the integrated semiconductor memory is embodied as a dynamic semiconductor memory.

11. The integrated semiconductor memory according to claim 10, wherein the integrated semiconductor memory is embodied as a synchronous dynamic semiconductor memory.

* * * * *